Figure 1:
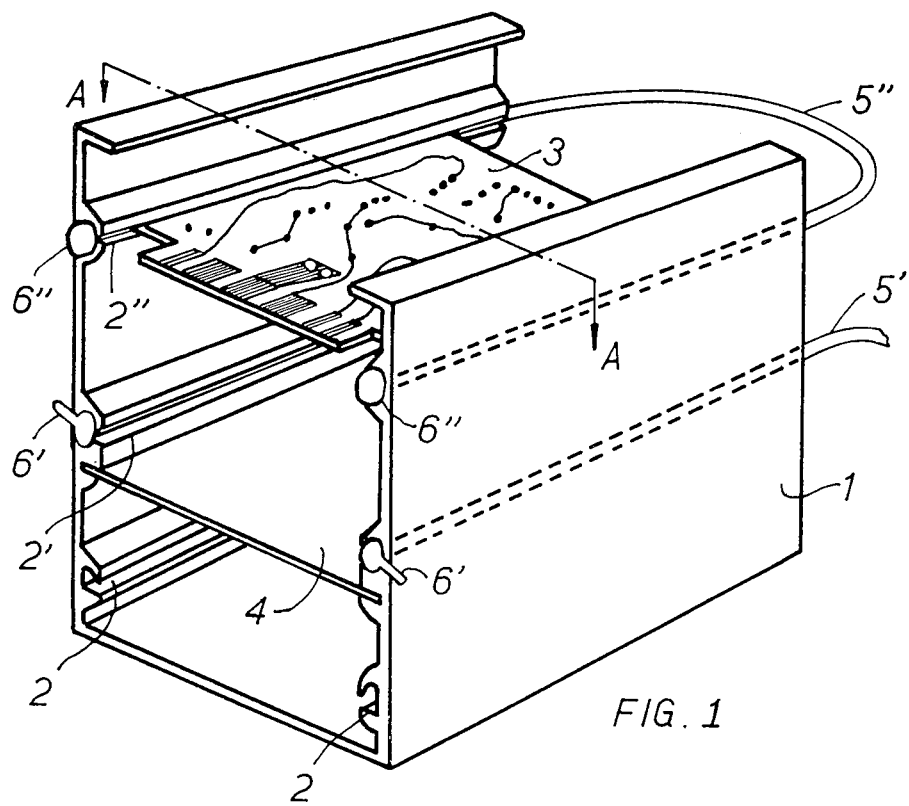

United States Patent [19]

Tetlie

[11] 4,002,953
[45] Jan. 11, 1977

[54] DEVICE FOR FIXING A PRINTED CIRCUIT BOARD TO A CASKET-LIKE SUPPORT

[75] Inventor: Per Tetlie, Horten, Norway

[73] Assignee: Aksjeselskapet Mikro-Elektronik, Horten, Norway

[22] Filed: May 8, 1975

[21] Appl. No.: 575,559

[30] Foreign Application Priority Data

May 15, 1974 Norway .............. 1771/74

[52] U.S. Cl. .................. 317/101 DH; 211/41
[51] Int. Cl.$^2$ ........................ H02B 1/02
[58] Field of Search .............. 317/101 DH; 211/41

[56] References Cited

UNITED STATES PATENTS

| | | | |
|---|---|---|---|
| 3,037,181 | 5/1962 | Leshner | 317/101 DH |
| 3,258,649 | 6/1966 | Arguin et al. | 317/101 DH |
| 3,678,342 | 7/1972 | Shaw | 317/101 DH |

*Primary Examiner*—David Smith, Jr.
*Attorney, Agent, or Firm*—Ladas, Parry, Von Gehr, Goldsmith & Deschamps

[57] ABSTRACT

A device for fixing a printed circuit board to a casket-like support has been described. The support is equipped with pairs of inside channels for guiding and supporting the circuit board, and the device comprises an elastic material which partly occupies the volume of the channels. The elastic material allows guiding when being extended by hand, and fixes the circuit board to the support when being in a relaxed condition.

3 Claims, 3 Drawing Figures

DEVICE FOR FIXING A PRINTED CIRCUIT BOARD TO A CASKET-LIKE SUPPORT

BACKGROUND OF THE INVENTION

The invention relates to a device for fixing a printed circuit board or card to a casket-like support having been equipped with inside channels or slots for guiding the circuit board in a pair of parallel channels when mounting the circuit board to the support, or when dismantling the board from the support.

Regarding electronic equipment which is exposed to vibrations and shaking, the circuit boards have to be fixed to the support. Then it comes naturally to fix the circuit boards in the channels by means of locking or clamping devices, for instance set screws or spring loaded clamps.

In many cases these provisions are satisfactory, despite that they often require use of structures that enhance the price and also delay eventual replacement of boards. In other cases, on the contrary, in which not even very small relative displacements between board and support can be allowed, said provisions are contingent on severe requirements to the material's resistance against deformation after continual mechanical strain. In general, such locking means are aimed at, that result in minimum inconvenience when used.

Thus, there exists a need for safe and simple locking means for printed circuit boards which are mounted in channels to a casket-like support, especially in connection with movable electronic equipment which, because of the circumstances, also may be subjected to rough treatment when being used.

SUMMARY OF THE INVENTION

The object of the invention is to procure a locking means which is safe under all of the conditions for which the electronic equipment is constructed, and which makes mounting and dismantling of the circuit board to, respectively from, the support by means of simple manipulations.

This is obtained by means of the device according to the invention, which device is characterized by an elastic material, for instance a rubber band, which partly occupies the volume of the channels and which in extended condition along the channel direction allows said guiding because of its reduced cross section, and which in relaxed condition fixes the circuit board to the support.

DESCRIPTION OF THE INVENTION

The invention is now to be explained by means of a preferred example of performance. It is referred to the drawing, where:

FIG. 1 is a perspective sketch of a casket-like support and a printed circuit board or card which is fixed thereto according to the invention, and FIG. 2 in a section through the board support of FIG. 1 illustrates the manner of operation of the fixing device according to the invention.

The casket-like support 1 in FIG. 1 is made from aluminum and is equipped with channels 2 for printed circuit boards 3 of which only one is shown in the figure, namely the one in the uppermost pair of channels 2''. Additionally, a separate wall 4 is shown, which wall can be dismantled. In the two uppermost pairs of channels 2' and 2'', there is arranged elastic ribbons or bands 5' and 5'' from rubber or another elastic material which partly occupy the volume of each of its channel pairs. The lowermost band 5' is prevented from being drawn through the one pair of channels 2' by means of locking end knots 6', whereas the uppermost band 5'' is locked correspondingly by means of more diligent prepared rubber heads 6''. On the opposite side of the support 1 the band 5' is cut as shown, whereas the band 5'' is kept as one band in order to facilitate the possibility of gripping the band by one hand when extending the band 5''. It appears from the lowermost pair of channels 2 that the circuit boards are resting on a plane surface in the channels, whereas the elastic material is arranged in the upper part of the channels and exerts pressure against a part of the one surface of the circuit board. This has been shown more explicitly in FIG. 2 wherein details corresponding to details in FIG. 1 has been given corresponding numerals. The numeral 7 indicates electronic components.

Figure 2A:
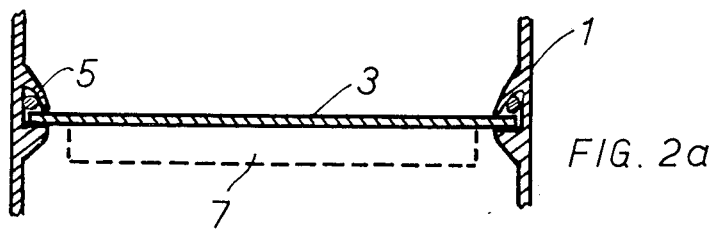
Figure 2B:
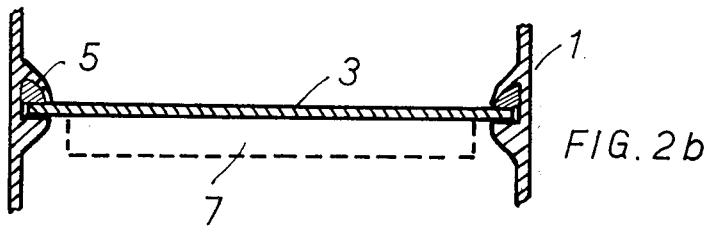

Mounting and dismantling of printed circuit boards 3 to, respectively from, the support 1 is performed by extending the band as explained above, by which manipulation the cross section of the band is reduced as shown in FIG. 2a, and simultaneously guide the board 3 in its channel pair inwards from the one end of the support 1 where the band 5 is protruding from the channels 2, and guide the board 3 out from this end during dismantling. When the band 5 is released, it is contracted, by which manipulation its cross section increases and fixes the board 3 in the channels 2 as shown in FIG. 2b.

In the drawing having been described, is shown somewhat simplified, a prototype of a receiving unit of a transportable radio equipment which comprises a transmitter unit and frequency synthetizing unit as well. The various units have different chassis profiles, of which one has been shown in FIG. 1. It will be realized that this example concerning a receiving unit describes one particular application of the fixing device according to the invention, and that other performances of supports for printed circuit boards are actual as other applications. Likewise, the channel profiles can be different, and the cross section of the elastic band as well. This band can also be extended from both ends of the support.

Thus, the channels can be right angled in some performances, even though it is preferred herein that they are formed with an edge or lip in order to keep the elastic band in position. The band can have a circular cross section as shown, or an eliptic or rectangular cross section, or any other cross section suited for the profile of the channel and element. In case the elastic band is to be extended from one end only, its other end can also be clamped to the support.

Supports similar to the shown casket-like support, can be produced in large quantities in the form of extruded profiles of several meters which are then cut into desired lengths. By use of aluminum for the board supports having been described, a good electrical contact to ground is obtained, which is a problem in connection with the more usually used plastic materials which in addition become brittle at low temperatures.

It has been proved that printed circuit boards which have been fixed according to the invention, do not move relative to the support even if the equipment is exposed to shaking. Quite contrary, eventual shaking causes that the elastic material contracts even more towards complete contraction and thus fixes the element still further to the support.

I claim:

1. A device for fixing a printed circuit board to a casket-like support equipped with a pair of parallel inside channels for guiding movement of the circuit board when it is inserted into and removed from the support, comprising at least one elongated element of elastic material extending along the channels and which in a normal, relaxed condition partly occupies the volume of the channels, said element being longitudinally stretchable with such longitudinal stretching being accompanied by a corresponding reduction in the cross section of the element, whereby the element in extended condition along the channel direction allows said movement because of its reduced cross section, and in relaxed condition fixes the circuit board to the support.

2. A device as claimed in claim 1, wherein respective such elongate elements are positioned in each of said channels, and each element is formed at one end to prevent the element from being drawn through its channel in the direction towards the other end of said element, said other end of the element protruding from the end of the channel and thus defining a gripping structure to allow longitudinal extension of the element.

3. A device as claimed in claim 1, wherein said elongate element has one end section disposed in one of said channels and an opposite end section disposed in the other of said channels, the two end sections being connected together by a bight portion, the two ends of the element being at one side of the support and the bight portion being at the opposite side of the support, and the ends of the element being formed to prevent them from being drawn through the respective channels towards said opposite side of the support, said bight portion protruding from the channels at said opposite side of the support and thus defining a gripping structure to allow longitudinal extension of the two end sections of the element.

* * * * *